United States Patent
Kawaguchi (10) Patent No.: US 8,703,837 B2
(45) Date of Patent: Apr. 22, 2014

(54) PHOTOCURABLE COMPOSITION AND PROCESS FOR PRODUCING MOLDED PRODUCT HAVING FINE PATTERN ON ITS SURFACE

(75) Inventor: Yasuhide Kawaguchi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 166 days.

(21) Appl. No.: 13/151,324

(22) Filed: Jun. 2, 2011

(65) Prior Publication Data

US 2011/0227257 A1    Sep. 22, 2011

Related U.S. Application Data

(63) Continuation of application No. PCT/JP2009/070125, filed on Nov. 30, 2009.

(30) Foreign Application Priority Data

Dec. 5, 2008  (JP) ................................. 2008-311015

(51) Int. Cl.
    *C08J 3/28*    (2006.01)
(52) U.S. Cl.
    USPC ............. 522/95; 522/153; 522/154; 522/156; 522/165; 522/90; 264/293
(58) Field of Classification Search
    USPC ...................... 522/154, 153, 95, 156; 264/293
    See application file for complete search history.

(56) References Cited

U.S. PATENT DOCUMENTS

| | | | |
|---|---|---|---|
| 6,696,220 B2 | 2/2004 | Bailey et al. | |
| 7,655,307 B2 | 2/2010 | Kim et al. | |
| 7,935,472 B2 * | 5/2011 | Ogino et al. | ............... 430/270.1 |
| 2007/0065757 A1 * | 3/2007 | Ogino et al. | .................. 430/311 |

(Continued)

FOREIGN PATENT DOCUMENTS

| | | | |
|---|---|---|---|
| JP | 2004-51790 | | 2/2004 |
| JP | 2004-051790 | * | 2/2004 |

(Continued)

OTHER PUBLICATIONS

International Search Report issued Feb. 23, 2010 in PCT/JP09/070125 filed Nov. 30, 2009.

*Primary Examiner* — Dimple Bodawala
*Assistant Examiner* — Robert J Grun
(74) *Attorney, Agent, or Firm* — Oblon, Spivak, McClelland, Maier & Neustadt, L.L.P.

(57) ABSTRACT

To provide a photocurable composition whereby it is possible to obtain a cured product having both a release property and flexibility, and a process whereby it is possible to produce a flexible molded product having on its surface a fine pattern having a reverse pattern of a mold precisely transferred. A photocurable composition comprising a compound (A) having at least two urethane bonds and at least two (meth)acryloyloxy groups and having a mass average molecular weight of less than 2,000, a compound (B) having a fluorine atom and at least one carbon-carbon unsaturated double bond, a compound (C) having one (meth)acryloyloxy group, a photopolymerization initiator (D), and a fluorinated surfactant (E), wherein in the total (100 mass %) of (A) to (E), (A) is from 10 to 50 mass %, (B) is from 5 to 35 mass %, (C) is from 15 to 75 mass %, (D) is from 1 to 12 mass %, and (E) is from 0.1 to 5 mass %, is used.

9 Claims, 1 Drawing Sheet

(56) References Cited

U.S. PATENT DOCUMENTS

| | | | |
|---|---|---|---|
| 2008/0107870 A1* | 5/2008 | Kawaguchi et al. | 428/156 |
| 2009/0052030 A1 | 2/2009 | Kaida et al. | |
| 2010/0038831 A1 | 2/2010 | Kawaguchi et al. | |
| 2010/0259821 A1 | 10/2010 | Kaida et al. | |
| 2011/0020617 A1 | 1/2011 | Kawaguchi | |

FOREIGN PATENT DOCUMENTS

| | | |
|---|---|---|
| JP | 2004-71934 | 3/2004 |
| JP | 2006-152074 | 6/2006 |
| WO | 2006-030625 | 3/2006 |
| WO | 2006/114958 | 11/2006 |

* cited by examiner

PHOTOCURABLE COMPOSITION AND PROCESS FOR PRODUCING MOLDED PRODUCT HAVING FINE PATTERN ON ITS SURFACE

TECHNICAL FIELD

The present invention relates to a photocurable composition and a process for producing a molded product having a fine pattern on its surface.

BACKGROUND ART

In the production of optical components, recording media, semiconductor devices, etc., as a method for forming a fine pattern in a short time, a method for forming a fine pattern on a surface of a substrate (nanoimprint method) is known wherein a mold having on its surface a reverse pattern of such a fine pattern, is pressed to a photocurable composition placed on the surface of a substrate, and the photocurable composition is irradiated with light to cure the photocurable composition thereby to form a fine pattern on the surface of the substrate (Patent Documents 1 and 2).

However, in such a method, the cured product of the photocurable composition adheres to the mold, whereby it is difficult to separate the cured product from the mold. Therefore, it is necessary to apply a release agent to the surface of the mold or to use a photocurable-composition whereby it is possible to form a cured product having a good release property.

However, when a release agent is used, it becomes difficult to precisely transfer the reverse pattern of the mold due to the film thickness of the release agent itself, uneven application of the release agent, etc.

On the other hand, as a photocurable composition capable of forming a cured product having a good release property, the following one has been proposed.

(1) A photocurable composition comprising a fluorinated monomer, a monomer containing no fluorine, a fluorinated surfactant or fluorinated polymer, and a photopolymerization initiator (Patent Document 3).

However, when the photocurable composition (1) is used, it is difficult to obtain a cured product having a moderate flexibility (hardness: 50 to 85). Therefore, when a mold is separated from the cured product, the cured product having a fine pattern formed is likely to be broken, and thus the transferring property sometimes deteriorates.

As a photocurable composition which is capable of forming a cured product having flexibility and which is excellent in transferring property, the following one has been proposed.

(2) A photocurable composition comprising a urethane (meth)acrylate oligomer, a bifunctional monomer and a photopolymerization initiator (Patent Document 4).

However, since the cured product of the photocurable composition (2) has a high adhesion, it has an insufficient release property.

Further, the nanoimprint method includes a step of placing a photocurable composition on a surface of a substrate or a surface of a mold. Accordingly, the photocurable composition is required to have characteristics such that it is capable of being applied without a special operation and does not flow off from the surface of the substrate or the mold. Therefore, it is also important for the photocurable composition used for the nanoimprint method that its viscosity can be properly adjusted.

PRIOR ART DOCUMENTS

Patent Documents

Patent Document 1: U.S. Pat. No. 6,696,220
Patent-Document 2: JP 2004-071934 A
Patent Document 3: WO 2006/114958
Patent Document 4: JP 2006-152074 A

DISCLOSURE OF INVENTION

Technical Problem

The present invention is to provide a photocurable composition whereby it is possible to obtain a cured product having both a release property and flexibility, and a process whereby it is possible to produce a flexible molded product having on its surface a fine pattern having a reverse pattern of a mold precisely transferred. Further, the present invention is to provide a photocurable composition having a viscosity which can be properly adjusted in order to be easily applied on a surface of a substrate or a mold.

Solution to Problem

The photocurable composition of the present invention comprises a compound (A) having at least two urethane bonds and at least two (meth)acryloyloxy groups and having a mass average molecular weight of less than 2,000 and a viscosity at 25° C. of at most 20 Pa·s, a compound (B) having fluorine atoms and at least one carbon-carbon unsaturated double bond (provided that the compound (A) is excluded), a compound (C) having one (meth)acryloyloxy group (provided that the compound (B) is excluded), a photopolymerization initiator (D), and a fluorinated surfactant (E), wherein in the total (100 mass %) of the compound (A), the compound (B), the compound (C), the photopolymerization initiator (D) and the fluorinated surfactant (E), the compound (A) is from 10 to 50 mass %, the compound (B) is from 5 to 35 mass %, the compound (C) is from 15 to 75 mass %, the photopolymerization initiator (D) is from 1 to 12 mass %, and the compound (E) is from 0.1 to 5 mass %.

The photocurable composition of the present invention preferably contains substantially no solvent.

The photocurable composition of the present invention preferably further contains at most 40 parts by mass of a compound (F) having at least two (meth)acryloyloxy groups (provided that the compound (A) and the compound (B) are excluded) per 100 parts by mass of the total of the compound (A), the compound (B), the compound (C), the photopolymerization initiator (D) and the fluorinated surfactant (E).

The photocurable composition of the present invention preferably has a viscosity at 25° C. of from 30 to 500 mPa·s.

The present invention provides a process for producing a molded product having a fine pattern on its surface, which comprises a step of bringing the photocurable composition of the present invention into contact with a reverse pattern surface of a mold having the reverse pattern of said fine pattern on said surface, a step of irradiating the photocurable composition with light in such a state that the photocurable composition is in contact with the surface of the mold, to cure the photocurable composition to form a cured product, and a step of separating the mold from the cured product to obtain a molded product having a fine pattern on its surface.

The present invention provides a process for producing a molded product having a fine pattern on its surface, which comprises a step of placing the photocurable composition of the present invention on a surface of a substrate, a step of pressing a mold having a reverse pattern of said fine pattern on its surface against the photocurable composition so that the reverse pattern of the mold is in contact with the photocurable composition, a step of irradiating the photocurable composition with light in such a state that the mold is pressed against the photocurable composition, to cure the photocurable composition to form a cured product, and a step of separating the mold, or the substrate and the mold, from the cured product to obtain a molded product having a fine pattern on its surface.

The present invention provides a process for producing a molded product having a fine pattern on its surface, which comprises a step of placing the photocurable composition of the present invention on a reverse pattern surface of a mold having the reverse pattern of said fine pattern on said surface, a step of pressing a substrate against the photocurable composition, a step of irradiating the photocurable composition with light in such a state that the substrate is pressed against the photocurable composition, to cure the photocurable composition to form a cured product, and a step of separating the mold, or the substrate and the mold, from the cured product to obtain a molded product having a fine pattern on its surface.

The present invention provides a process for producing a molded product having a fine pattern on its surface, which comprises a step of bringing a substrate and a mold having a reverse pattern of said fine pattern on its surface close to or in contact with each other so that the reverse pattern of the maid is on the substrate side, a step of filling the space between the substrate and the mold with the photocurable composition of the present invention, a step of irradiating the photocurable composition with light in such a state that the substrate and the mold are close to or in contact with each other, to cure the photocurable composition to form a cured product, and a step of separating the mold, or the substrate and the mold from the cured product to obtain a molded product having a fine pattern on its surface.

Advantageous Effects of Invention

By using the photocurable composition of the present invention, it is possible to obtain a cured product having both a release property and flexibility. Further, the photocurable composition of the present invention has a moderate viscosity, whereby its application to a surface of a substrate or a mold can be easily carried out.

By each process for producing a molded product having a fine pattern on its surface according to the present invention, it is possible to produce a flexible molded product having on its surface a fine pattern having a reverse pattern of a mold precisely transferred.

DESCRIPTION OF EMBODIMENTS

In the present specification, a compound represented by the formula (A1) will be referred to as a compound (A1). Compounds represented by other formulae will also be referred to in the same manner. Further, in the present specification, a (meth)acryloyloxy group means an acryloyloxy group or a methacryloyloxy group. Further, in the present specification, a (meth)acrylate means an acrylate or a methacrylate.

<Photocurable Composition>

The photocurable composition of the present invention is a composition containing, as essential components, compounds (A) to (C), a photopolymerization initiator (D) and a fluorinated surfactant (E), and containing, as the case requires, a compound (F), additives (G), and so on.

Compound (A): A compound having at least two urethane bonds and at least two (meth)acryloyloxy groups and having a mass average molecular weight of less than 2,000 and a viscosity at 25° C. of at most 20 Pa·s.

Compound (B): A compound having fluorine atoms and at least one carbon-carbon unsaturated double bond (provided that the compound (A) is excluded).

Compound (C): A compound having one (meth)acryloyloxy group (provided that the compound (B) is excluded).

Compound (F): A compound having at least two (meth)acryloyloxy groups (provided that the compound (A) and the compound (B) are excluded).

The viscosity at 25° C. of the photopolymerizable composition of the present invention is preferably from 30 to 500 mPa·s, more preferably from 40 to 300 mPa·s. When the viscosity of the photopolymerizable composition is within such a range, the contact of the photopolymerizable composition with the surface having a reverse pattern of a mold can easily be carried out without carrying out any special operation (such as an operation to heat the photocurable composition at a high temperature to make the viscosity low). Further, the photocurable composition can be easily applied on the surface of a substrate without flowing off from the surface of the substrate.

The photocurable composition of the present invention preferably contains substantially no solvent. When the photocurable composition contains substantially no solvent, curing of the photocurable composition can easily be carried out without carrying out any special operation (such as an operation to heat the photocurable composition at a high temperature to remove the solvent) other than irradiation with light.

The solvent is a compound having an ability to dissolve any of the compounds (A) to (C), photopolymerization initiator (D), fluorinated surfactant (E) and compound (F).

"Contains substantially no solvent" means that no solvent is contained at all, or a solvent to be used at the time of preparing the photocurable composition may be contained as a residual solvent. However, the residual solvent is preferably removed as far as possible and is preferably at most 10 mass % in the photocurable composition (100 mass %).

The sensitivity of the photocurable composition of the present invention may be represented by the integrated quantity of light until the photocurable composition is completely cured when the photocurable composition having a thickness of about 1.5 μm is irradiated with light from a high pressure mercury lamp (a light source having main wavelengths of 254 nm, 315 nm and 365 nm at from 1.5 to 2.0 kHz). The integrated quantity of light is preferably at most 1,000 mJ/cm$^2$, more preferably from 150 mJ/cm$^2$ to 750 mJ/cm$^2$. If the integrated quantity of light exceeds 1,000 mJ/cm$^2$, it takes a time of at least 20 seconds to cure the photopolymerizable composition, whereby the production efficiency tends to be poor.

The sensitivity of the photocurable composition is obtained as follows.

The photocurable composition is applied on the surface of a substrate by a spin coating method to form a coating film having a thickness of about 1.5 μm, which was irradiated with light from a high pressure mercury lamp (a light source having main wavelengths of 254 nm, 315 nm and 365 nm at from 1.5 to 2.0 kHz), whereby the integrated quantity of light until the composition is completely cured, is obtained and taken as the sensitivity. Whether or not the photocurable composition is completely cured, is judged by measuring the IR infrared absorption spectrum to see the presence or absence of an absorption of a carbon-carbon unsaturated double bond (in the vicinity of 1,635 cm$^{-1}$).

The contact angle of the photocurable composition of the present invention after curing to water is an index for the release property of the cured product. The contact angle is preferably at least 85°, more preferably from 90° to 116°. If the contact angle is less than 85°, the release will be difficult, and the photocurable composition will adhere to a mold, which may lead to breakage of the mold. The contact angle is measured in accordance with JIS R3257.

The hardness of the cured product of the photocurable composition of the present invention is preferably from 50 to 85. If the hardness is less than 50, the cured product is too flexible, and thus it is difficult to maintain the shape. Particularly, a molded product having a fine pattern made of the cured product of the photocurable composition on a surface of a substrate is used as a mold (such as a daughter mold or a replica mold), the fine pattern becomes deformed, and the role as a mold will not be fulfilled. If the hardness exceeds the cured product is too hard, and it may possibly be easily broken. Particularly, when a molded product having a fine pattern made of a cured product of the photocurable composition on a surface of a substrate is used as a mold (such as a daughter mold or a replica mold), a stress will be exerted to the fine pattern at the time of release, and the fine pattern will become likely to be broken.

The hardness is measured by using a hardness meter in accordance with JIS K-6301.

(Compound (A))

The compound (A) is a compound having at least two urethane bonds and at least two (meth)acryloyloxy groups and having a mass average molecular weight of less than 2,000 and a viscosity at 25° C. of at most 20 Pa·s.

The mass average molecular weight of the compound (A) is less than 2,000, preferably at least 400 and less than 1,600. If the mass average molecular weight of the compound (A) is at least 2,000, the compound (A) will become hardly likely to be uniformly compatible with other components, and the cured product will be turbid.

The viscosity at 25° C. of the compound (A) is at most 20 Pa·s, preferably at least 0.1 Pa·s and less than 5 Pa·s. If the viscosity exceeds 20 Pa·s, the compound (A) will become hardly likely to be uniformly compatible with other components, and the cured product will be turbid.

The compound (A) is preferably at least one member selected from the group consisting of a compound represented by the following formula (A1) and a compound represented by the following formula (A3):

(CH$_2$=CR—COO—(X—O)$_s$—CONH)$_k$-Q    (A1)

wherein R is a hydrogen atom or a methyl group, X is a C$_{2-10}$ alkylene group, s is an integer of from 1 to 100, k is an integer of from 2 to 4, and Q is a k-valent group.

X is a C$_{2-10}$ alkylene group. The alkylene group may have a linear structure or a branched structure. The number of carbon atoms of the alkylene group is preferably from 2 to 6, further preferably from 2 to 4. More specifically, X is preferably —CH$_2$CH$_2$— or —CH$_2$CH(CH$_3$)—. The compound (A1) has a structure of (X—O), whereby it is possible to impart adequate flexibility to the photocurable composition.

m is preferably from 1 to 90, particularly preferably from 1 to 80, further particularly preferably from 1 to 30.

k is an integer of from 2 to 4, preferably 2 or 4.

Q is a k-valent group, preferably a k-valent hydrocarbon group. Q may have any of an aliphatic structure, an alicyclic structure and an aromatic ring structure, and it preferably has an aliphatic structure or an alicyclic structure from the viewpoint of the transparency of the molded product obtained from the photocurable composition and the compatibility with other components contained in the photocurable composition.

Q may, for example, be a C$_{2-10}$ alkylene group or the following hydrocarbon ring groups.

The compound (A) is preferably a compound represented by the following formula (A10), particularly preferably a compound represented by the following formula (A11).

(A10)

(A11)

in the formula (A10), $R^{21}$ is a hydrogen atom or a methyl group, and Q is the same as above. J is a $C_{2-10}$ alkylene group, —$(C_2H_4O)_p$—$C_2H_4$—, —$(C_3H_6O)_p$—$C_3H_6$— or any of the bivalent groups represented by the following formulae, and p is an integer of from 1 to 29.

In the formula (A11), $R^{21}$ is the same as above, and $R^{11}$ is a hydrogen atom or a methyl group. Usually, the compound (A11) is available as a mixture of a compound wherein $R^{11}$ is a hydrogen atom and a compound wherein $R^{11}$ is a methyl group at a mixing rate of 1:1. Q is the same as above.

Further, as the compound (A), the following compound (A3) is also preferred.

In the formula, each of $R^{31}$, $R^{32}$ and $R^{33}$ which are independent of one another, is a hydrogen atom or a methyl group, and the other symbols are the same as above.

(A3)

The commercial product of the compound (A11) may, for example, be diurethane dimethacrylate (manufactured by Aldrich).

The commercial product of the compound (A10) may, for example, be UA-4200 or UA-4400 (manufactured by Shin-Nakamura Chemical Co., Ltd.), or KRM 8098, EBECRYL 4858, EBECRYL 8402 or EBECRYL 9270 (manufactured by DAICEL-CYTEC Co., Ltd.).

The commercial product of the compound (A3) may, for example, be EBECRYL 8210 (manufactured by DAICEL-CYTEC Co., Ltd.).

As the compound (A), one type may be used alone, or two or more types may be used in combination.

The content of the compound (A) in the photocurable composition is from 10 to 50 mass %, preferably from 15 to 40 mass %, in the total (100 mass %) of the compound (A), the compound (B), the compound (C), the photopolymerization initiator (D) and the fluorinated surfactant (E). When the content of the compound (A) is at least 10 mass %, it is possible to obtain a cured product of the photocurable composition having a hardness of at most 85. When the content of the compound (A) is at most 50 mass %, the cured product is free from phase separation.

It is presumed that in the photocurable composition of the present invention, the urethane bond moiety in the compound (A) forms a hydrogen bond with the (meth)acryloyl group moiety in another component such as the compound (B), and it is considered that the viscosity of the photocurable composition is thereby high.

Further, it is considered that the compound (A) has a structure represented by the symbol J in the above formula (A10) (specifically an alkylene group, an oxyalkylene group, or the like), whereby it is possible to impart flexibility to the photocurable composition.

Further, the portion between a plurality of urethane bonds in the compound (A) has a structure composed of a hydrocarbon having a relatively small mobility. It is also considered that this portion contributes to improvement of the release property because of the hydrophobic property of the hydrocarbon, and further it is also considered that the urethane bonds having a high polarity are suppressed so that they will not come out to the surface layer, which contributes to improvement of the release property.

As discussed above, when the photocurable composition of the present invention is used, a cured product having both a release property and flexibility may be obtained. Further, adjustment of the viscosity of the photocurable composition becomes easy, and its application to the surface of a substrate or a mold can be easily carried out.

(Compound (B))

The compound (B) is a compound having fluorine atoms and at least one carbon-carbon unsaturated double bond (provided that the compound (A) is excluded).

As the compound (B) is contained in the photocurable composition of the present invention, separating of the cured photocurable composition from the mold can easily be carried out.

The compound (B) may, for example, be a fluoro(meth)acrylate, a fluorodiene, a fluorovinyl ether or a fluorocyclic monomer. From the viewpoint of the compatibility, a fluoro(meth)acrylate is preferred.

The fluoro(meth)acrylate may, for example, be 3-(perfluoro-3-methylbutyl)-2-hydroxybutyl(meth)acrylate, 2,2,2-trifluoro-1-(trifluoromethyl)ethyl-(meth)acrylate,
$CH_2=CHCOO(CH_2)_2(CF_2)_{10}F$,
$CH_2=CHCOO(CH_2)_2(CF_2)_8F$,
$CH_2=CHCOO(CH_2)_2(CF_2)_6F$,
$CH_2=C(CH_3)COO(CH_2)_2(CF_2)_{10}F$,
$CH_2=C(CH_3)COO(CH_2)_2(CF_2)_8F$,
$CH_2=C(CH_3)COO(CH_2)_2(CF_2)_6F$,
$CH_2=CHCOOCH_2(CF_2)_6F$,
$CH_2=C(CH_3)COOCH_2(CF_2)_6F$,
$CH_2=CHCOOCH_2(CF_2)_7F$,
$CH_2=C(CH_3)COOCH_2(CF_2)_7F$,
$CH_2=CHCOOCH_2CF_2CF_2H$,
$CH_2=CHCOOCH_2(CF_2CF_2)_2H$,
$CH_2=CHCOOCH_2(CF_2CF_2)_4H$,
$CH_2=C(CH_3)COOCH_2CF_2CF_2H$,
$CH_2=C(CH_3)COOCH_2(CF_2CF_2)_2H$,
$CH_2=C(CH_3)COOCH_2(CF_2CF_2)_4H$,
$CH_2=CHCOOCH_2CF_2OCF_2CF_2OCF_3$,
$CH_2=CHCOOCH_2CF_2O(CF_2CF_2O)_3CF_3$,
$CH_2=C(CH_3)COOCH_2CF_2OCF_2CF_2OCF_3$,
$CH_2=C(CH_3)COOCH_2CF_2O(CF_2CF_2O)_3CF_3$,
$CH_2=CHCOOCH_2CF(CF_3)OCF_2CF(CF_3)O(CF_2)_3F$,
$CH_2=CHCOOCH_2CF(CF_3)O(CF_2CF(CF_3)O)_2(CF_2)_3F$,
$CH_2=C(CH_3)COOCH_2CF(CF_3)OCF_2CF(CF_3)O(CF_2)_3F$,
$CH_2=C(CH_3)COOCH_2CF(CF_3)O(CF_2CF(CF_3)O)_2(CF_2)_3F$,
$CH_2=CFCOOCH_2CH(OH)CH_2(CF_2)_6CF(CF_3)_2$,
$CH_2=CFCOOCH_2CH(CH_2OH)CH_2(CF_2)_6CF(CF_3)_2$,
$CH_2=CFCOOCH_2CH(OH)CH_2(CF_2)_{10}F$, or
$CH_2=CFCOOCH_2CH(CH_2OH)CH_2-(CF_2)_{10}F$.

The fluoro(meth)acrylate is preferably a compound (B1), from the viewpoint of the compatibility and environmental characteristics:

(B1)

wherein $R^1$ is a hydrogen atom or a methyl group, each of $R^2$ and $R^3$ which are independent of each other, is a hydrogen atom or a $C_{1-4}$ alkyl group, each of $R^4$ and $R^5$ which are independent of each other, is a fluorine atom, a $C_{1-4}$ perfluoroalkyl group or a $C_{1-4}$ perfluoroalkoxy group, $R^6$ is a hydrogen atom or a fluorine atom, m is an integer of from 1 to 4, and n is an integer of from 1 to 16. n is preferably an integer of from 1 to 10 from the viewpoint of the compatibility and is preferably from 3 to 6 from the viewpoint of the environmental characteristics.

As the compound (B), one type may be used alone, or two or more types may be used in combination.

The content of the compound (B) in the photocurable composition is from 5 to 35 mass %, preferably from 10 to 25 mass %, in the total (100 mass %) of the compound (A), the compound (B), the compound (C), the photopolymerization initiator (D) and the fluorinated surfactant (E). When the content of the compound (B) is at least 5 mass %, it is possible to obtain a cured product excellent in release property, and further, it is possible to suppress foaming of the photocurable composition.

As foaming of the photocurable composition can be suppressed, filtration becomes easy during the preparation, and further, it is possible to eliminate a defect in the pattern shape due to inclusion of foams during nanoimprint. When the content of the compound (B) is at most 35 mass %, mixing can be carried out uniformly, whereby it is possible to obtain a cured product excellent in mechanical strength.

(Compound (C))

The compound (C) is a compound having one (meth)acryloyloxy group (provided that the compound (B) is excluded).

The compound (C) is a component to let another component dissolve and to improve the compatibility of the compound (A) with the compound (B). When the compatibility of the compound (A) with the compound (B) is good, it is possible to suppress foaming at the time of preparation of a photocurable composition and to facilitate filtration through the filter, whereby the preparation of the photocurable composition will be facilitated, or a uniform photocurable composition can be obtained. Further, as a homogeneous cured product is obtainable, the release property and mechanical strength may be sufficiently provided.

The compound (C) is preferably an acrylic acid ester or a methacrylic acid ester. In such a compound, an oxygen atom of an ester structure (COO—) is preferably bonded to a $C_{1-30}$ organic group. The number of carbon atoms of the organic group is particularly preferably from 4 to 20, further particularly preferably from 4 to 12.

The organic group may, for example, be a linear alkyl group, a branched alkyl group, a cycloalkyl group, an alkyl group substituted by an aryl group, an allyl group, a bridged hydrocarbon group, a group having a repeating structure of an oxyalkylene chain, an aromatic group or a heterocyclic group. Such a group may be substituted by a hetero atom such as a nitrogen atom or an oxygen atom, or a silicon group, it may be substituted by a functional group such as a hydroxy group or an amino group, or it may have an unsaturated bond or a free carboxy group.

The organic group is preferably a linear alkyl group, a branched alkyl group, a cycloalkyl group or a bridged hydrocarbon group.

As the compound (C), the following compounds may be mentioned.

2-Ethylhexyl(meth)acrylate, butyl(meth)acrylate, ethoxyethyl(meth)acrylate, methoxyethyl(meth)acrylate, allyl (meth)acrylate, 2-hydroxyethyl(meth)acrylate, 2-hydroxypropyl(meth)acrylate, octyl(meth)acrylate, decyl(meth) acrylate, n-butyl(meth)acrylate, tert-butyl(meth)acrylate, behenyl(meth)acrylate, stearyl(meth)acrylate, isostearyl (meth)acrylate, lauryl(meth)acrylate, glycidyl(meth)acrylate, tetrahydrofurfuryl(meth)acrylate, 2-methyl-2-adamantyl(meth)acrylate, 2-ethyl-2-adamantyl(meth)acrylate, 3-hydroxy-1-adamantyl(meth)acrylate, 1-adamantyl(meth) acrylate, isobornyl(meth)acrylate, 4-tert-butylcyclohexyl (meth)acrylate, 3-(trimethoxysilyl)propyl(meth)acrylate, N,N-diethylaminoethyl(meth)acrylate, N,N-dimethylaminoethyl(meth)acrylate, (2-(tert-butylamino)ethyl(meth)acrylate, phenoxyethyl(meth)acrylate, 2-hydroxy-3-phenoxypropyl(meth)acrylate, 2-(4-benzoyl-3-hydroxyphenoxy)ethyl (meth)acrylate, phenoxyethylene glycol (meth)acrylate, phenoxydiethylene glycol (meth)acrylate, methoxytriethylene glycol (meth)acrylate, methoxypolyethylene glycol (meth)acrylate, 2-(meth)acryloyloxyethyl hexahydrophthalic acid, 2-(meth)acryloyloxyethyl succinic acid, benzyl(meth)acrylate and 1,2,2,6,6-pentamethyl-4-piperidyl (meth)acrylate.

Additionally, a compound such as β-carboxyethyl(meth) acrylate, o-phenylphenol glycidyl ether (meth)acrylate or hydroxyethylated o-phenylphenol (meth)acrylate may also be used.

As the compound (C), one type may be used alone, or two or more types may be used in combination.

The content of the compound (C) in the photocurable composition is from 15 to 75 mass %, preferably from 20 to 45 mass %, in the total (100 mass %) of the compound (A), the compound (B), the compound (C), the photopolymerization initiator (D) and the fluorinated surfactant (E). When the content of the compound (C) is at least 15 mass %, the compatibility of the compound (A) with the compound (B) will be good. When the content of the compound (C) is at most 75 mass %, the sensitivity will be at most 1,000 mJ/cm$^2$, which is a good sensitivity.

(Photopolymerization Initiator (D))

The photopolymerization initiator (D) may, for example, be an acetophenone photopolymerization initiator, a benzoin photopolymerization initiator, a benzophenone photopolymerization initiator, a thioxanthone photopolymerization initiator, an α-aminoketone photopolymerization initiator, an α-hydroxyketone photopolymerization initiator, an α-acyloxime ester, benzyl-(o-ethoxycarbonyl)-α-monooxime, acylphosphine oxide, glyoxyester, 3-ketocoumarin, 2-ethylanthraquinone, camphorquinone, tetramethylthiuram sulfide, azobisisobutyronitrile, benzoyl peroxide, a dialkyl peroxide or tert-butylperoxy pivalate. From the viewpoint of the sensitivity and compatibility, an acetophenone photopolymerization initiator, a benzoin photopolymerization initiator, an α-aminoketone photopolymerization initiator or a benzophenone photopolymerization initiator is preferred.

As the acetophenone photopolymerization initiator, the following compounds may be mentioned.

Acetophenone, p-(tert-butyl) 1',1',1'-trichloroacetophenone, chloroacetophenone, 2',2'-diethoxyacetophenone, hydroxyacetophenone, 2,2-dimethoxy-2'-phenylacetophenone, 2-aminoacetophenone, a dialkylaminoacetophenone, etc.

As the benzoin photopolymerization initiator, the following compounds may be mentioned.

Benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one, benzyl dimethyl ketal, etc.

As the α-aminoketone photopolymerization initiator, the following compounds may be mentioned.

2-Benzyl-2-dimethylamino-1-(4-morpholinophenyl)-butanone-1,2-methyl-1[4-(methylthio)phenyl]-2-morpholinopropan-1-one, etc.

As the benzophenone photopolymerization initiator, the following compounds may be mentioned.

Benzophenone, benzoyl benzoic acid, methyl benzoyl benzoate, methyl-o-benzoyl benzoate, 4-phenylbenzophenone, hydroxybenzophenone, hydroxypropylbenzophenone, acrylbenzophenone, 4,4'-bis(dimethylamino)benzophenone, etc.

As the photopolymerization initiator (D), one type may be used alone, or two or more types may be used in combination.

The content of the photopolymerization initiator (D) in the photocurable composition is from 1 to 12 mass %, preferably from 3 to 10 mass %, in the total (100 mass %) of the compound (A), the compound (B), the compound (C), the photopolymerization initiator (D) and the fluorinated surfactant (E). When the content of the photopolymerization initiator (D) is at least 1 mass %, it is possible to easily obtain a cured product without carrying out an operation of e.g. heating. When the content of the photopolymerization initiator (D) is at most 12 mass %, mixing can be carried out uniformly, whereby the photopolymerization initiator (D) remaining in the cured product will be less, and deterioration of the physical properties of the cured product can be suppressed.

(Fluorinated Surfactant (E))

The fluorinated surfactant (E) is a component to improve the release property of the cured product.

As the fluorinated surfactant (E), a fluorinated surfactant having a fluorine content of from 10 to 70 mass %, is preferred, and a fluorinated surfactant having a fluorine content of from 10 to 40 mass %, is more preferred. The fluorinated surfactant may be water-soluble or lipid soluble, preferably lipid soluble from the viewpoint of the compatibility of the photocurable composition and the dispersibility of the cured product.

The fluorinated surfactant (E) is preferably an anionic fluorinated surfactant, a cationic fluorinated surfactant, an amphoteric fluorinated surfactant or a nonionic fluorinated surfactant. From the viewpoint of the compatibility of the photocurable composition and the dispersibility of the cured product, the nonionic fluorinated surfactant is more preferred.

The anionic fluorinated surfactant is preferably a polyfluoroalkylcarboxylic acid salt, a polyfluoroalkylphosphoric acid ester or a polyfluoroalkylsulfonic acid salt.

Specific examples of the anionic fluorinated surfactant include Surflon S-111 (tradename, manufactured by AGC Seimi Chemical Co., Ltd.), Fluorad FC-143 (tradename, manufactured by Sumitomo 3M Limited) and MEGAFACE F-120 (tradename, manufactured by DIC).

The cationic fluorinated surfactant is preferably a trimethylammonium salt of a polyfluoroalkylcarboxylic acid, or a trimethylammonium salt of a polyfluoroalkylsulfonic acid amide.

Specific examples of the cationic fluorinated surfactant include Surflon S-121 (tradename, manufactured by AGC Seimi Chemical Co., Ltd.), Fluorad FC-134 (tradename, manufactured by Sumitomo 3M Limited) and MEGAFACE F-150 (tradename, manufactured by DIC).

The amphoteric fluorinated surfactant is preferably a polyfluoroalkylbetain.

Specific examples of the amphoteric fluorinated surfactant include Surflon S-132 (tradename, manufactured by AGC Seimi Chemical Co., Ltd.), Fluorad FX-172 (tradename, manufactured by Sumitomo 3M Limited) and MEGAFACE F-120 (tradename, manufactured by DIC).

The nonionic fluorinated surfactant is preferably a polyfluoroalkylamine oxide or a polyfluoroalkyl'alkylene oxide adduct.

Specific examples of the nonionic fluorinated surfactant include Surflon S-145 (tradename, manufactured by AGC Seimi Chemical Co., Ltd.), Surflon S-393 (tradename, manufactured by AGC Seimi Chemical Co., Ltd.), Surflon KH-20 (tradename, manufactured by AGC Seimi Chemical Co., Ltd.), Surflon KH-40 (tradename, manufactured by AGC Seimi Chemical Co., Ltd.), Fluorad FC-170 (tradename, manufactured by Sumitomo 3M Limited), Fluorad FC-430 (tradename, manufactured by Sumitomo 3M Limited), and MEGAFACE F-141 (tradename, manufactured by DIC).

As the fluorinated surfactant (E), one type may be used alone, or two or more types may be used in combination.

The content of the fluorinated surfactant (E) is preferably from 0.1 to 5 mass %, more preferably from 0.2 to 1 mass %, in the total (100 mass %) of the compound (A), the compound (B), the compound (C), the photopolymerization initiator (D) and the fluorinated surfactant (E). When the content of the fluorinated surfactant (E) is at least 0.1 mass %, the release property will be improved. When the content of the fluorinated surfactant (E) is at most 5 mass %, the hindrance in curing of the photocurable composition can be suppressed, and phase separation of the cured product can be suppressed.

(Compound (F))

The photocurable composition of the present invention may contain a compound (F) having at least two (meth)acryloyloxy groups, other than the compound (A) and the compound (B), to improve the sensitivity of the cured product. The number of the (meth)acryloyloxy groups in the compound (F) is preferably from 2 to 10, particularly preferably from 2 to 6.

The compound (F) is preferably a (meth)acrylate of a diol such as glycol, a (meth)acrylate of a triol such as glycerol or trimethylol, or a (meth)acrylate of a tetraol such as pentaerythritol. Such a compound may contain a silicon atom.

As the compound (F), the following compounds may be mentioned.

A polyoxyethylene glycol di(meth)acrylate such as ethylene glycol di(meth)acrylate, diethylene glycol di(meth)acrylate or tetraethylene glycol di(meth)acrylate, a polypropylene glycol di(meth)acrylate such as dipropylene glycol di(meth)acrylate, 1,3-butanediol di(meth)acrylate, 1,4-butanediol di(meth)acrylate, glycerol 1,3-diglycerolate di(meth)acrylate, 1,6-hexanediol ethoxylate di(meth)acrylate, 1,6-hexanediol propoxylate di(meth)acrylate, 1,6-hexanediol di(meth)acrylate, 3-hydroxy-2,2-dimethylpropionate di(meth)acrylate, 1,9-nonanediol di(meth)acrylate, 1,10-decanediol di(meth)acrylate, neopentyl glycol di(meth)acrylate, neopentyl glycol propoxylate di(meth)acrylate, glycerol di(meth)acrylate, propylene glycol glycerolate di(meth)acrylate, tripropylene glycol di(meth)acrylate, triethylene glycol di(meth)acrylate, tetraethylene glycol di(meth)acrylate, tripropylene glycol glycerolate di(meth)acrylate, 2-hydroxy-3-acryloyloxypropyl(meth)acrylate, 2-methyl-1,3-propanediol diacrylate, trimethylolpropane benzoate di(meth)acrylate, trimethylolpropane tri(meth)acrylate, trimethylolpropane ethoxy tri(meth)acrylate, ethoxylated trimethylolpropane triacrylate, propoxylated trimethylolpropane triacrylate, 1,3-bis(3-methacryloyloxypropyl)-1,1,3,3-tetramethyldisiloxane, glycerin propoxy tri(meth)acrylate, pentaerythritol di(meth)acrylate mono stearyl acid, trimethylolpropane ethoxylate methyl ether di(meth)acrylate, pentaerythritol tri(meth)acrylate, pentaerythritol tetra(meth)acrylate, pentaerythritol ethoxy tetra(meth)acrylate, ditrimethylolpropane tetra(meth)acrylate, propoxylated pentaerythritol tetraacrylate, dipentapentaerythritol hexa(meth)acrylate, etc.

As the compound (F), one type may be used alone, or two or more types may be used in combination.

The content of the compound (F) in the photocurable composition is at most 40 parts by mass, preferably at most 30 parts by mass, per 100 parts by mass of the total of the compound (A), the compound (B), the compound (C), the photopolymerization initiator (D) and the fluorinated surfactant (E). When the content of the compound (F) is at most 40 parts by mass, the respective components are uniformly compatible with one another while the sensitivity is improved, and it is possible to suppress the viscosity of the photocurable composition at a low level.

(Additives (G))

The photocurable composition may contain other additives (G) other than the compounds (A) to (C), the photopolymerization initiator (D), the fluorinated surfactant (E) and the compound (F).

The additives (G) may, for example, be a photosensitizer, a resin, metal oxide fine particles, a carbon compound, metal fine particles and other organic compounds.

The photosensitizer may, for example, be n-butylamine, di-n-butylamine, tri-n-butylphosphine, allylthiourea, s-benzyl isothiuronium-p-toluene sulfinate, or an amine compound such as triethylamine, diethylaminoethyl methacrylate, triethylene tetramine or 4,4'-bis(dialkylamino)benzophenone.

The resin may, for example, be a fluorinated polymer, a polystyrene, a polythiophene, a polyester oligomer, a polycarbonate or a poly(meth)acrylate.

The metal oxide fine particles may, for example, be titania, silica-coated titania, zirconia, zinc oxide, silica, alumina or iron oxide.

The carbon compound may, for example, be carbon nanotube, fullerene, diamond or DLC (diamond-like carbon).

The metal fine particles may, for example, be copper or platinum.

Other organic compounds may, for example, be porphyrin and metal-encapsulated porphyrin.

The total amount of the additives (G) is preferably at most 20 parts by mass per 100 parts by mass of the total of the compound (A), the compound (B), the compound (C), the photopolymerization initiator (D) and the fluorinated surfactant (E). When the total amount of the additives (G) is at most 20 parts by mass, the additives (G) may be uniformly mixed into the photocurable composition, and it is possible to obtain a homogeneous photocurable composition.

The photocurable composition of the present invention as described above is able to exhibit both a release property and flexibility, at the same time and sufficiently. Accordingly, it is possible to easily obtain a molded product having on its surface a fine pattern having a reverse pattern of a mold precisely transferred without damaging the fine pattern.

<Process for Producing Molded Product Having Fine Pattern on its Surface>

The process for producing a molded product having a fine pattern on its surface according to the present invention, comprises the following steps (1) to (3):

(1) a step of bringing the photocurable composition of the present invention in contact with a reverse pattern surface of a mold having the reverse pattern of said fine pattern on said surface, (2) a step of irradiating the photocurable composition with light in such a state that the photocurable composition is in contact with the surface of the mold, to cure the photocurable composition to form a cured product, and (3) a step of separating the mold from the cured product to obtain a molded product having a fine pattern on its surface.

More specifically, the following processes (a) to (c) may be mentioned as the process for producing a molded product having a fine pattern on its surface according to the present invention.

Figure 1:
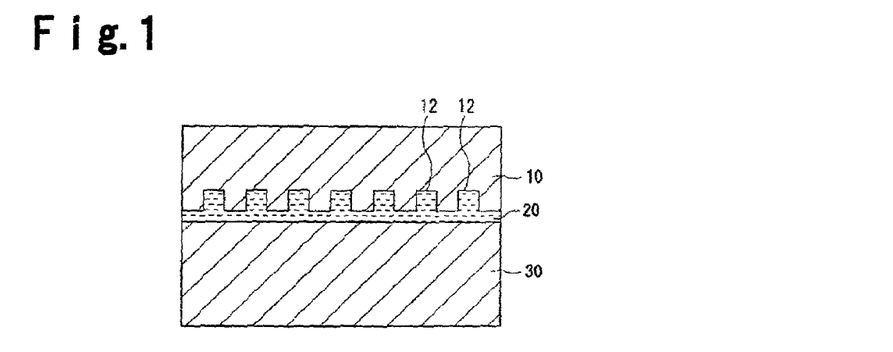
FIG. 1 is a cross-sectional view illustrating an embodiment of the process for producing a molded product having a fine pattern on its surface.

Process (a):

A process comprising the following steps (a-1) to (a-4):

(a-1) a step of placing the photocurable composition 20 on a surface of a substrate 30, as shown in FIG. 1, (a-2) a step of pressing a mold 10 against the photocurable composition 20 so that the reverse pattern 12 of the mold 10 is in contact with the photocurable composition 20, as shown in FIG. 1, (a-3) a step of irradiating the photocurable composition 20 with light in such a state that the mold 10 is pressed against the photocurable composition 20, to cure the photocurable composition 20 to form a cured product, and (a-4) a step of separating the mold 10, or the substrate 30 and the mold 10, from the cured product to obtain a molded product having a fine pattern on its surface.

Figure 2:
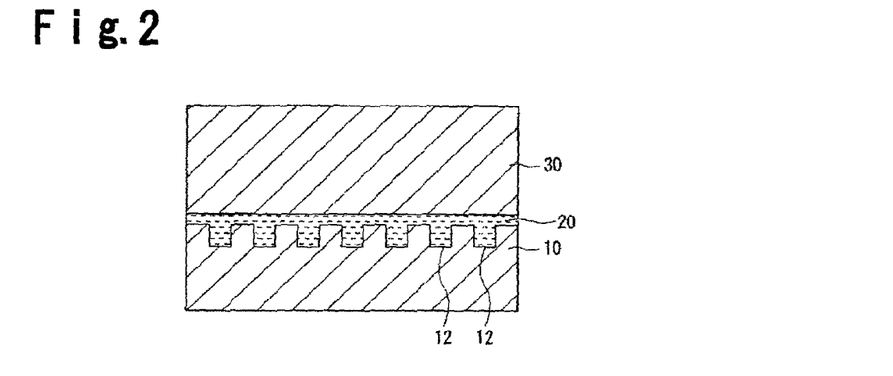
FIG. 2 is a cross-sectional view illustrating another embodiment of the process for producing a molded product having a fine pattern on its surface.

Process (b):

A process comprising the following steps (b-1) to (b-4):

(b-1) a step of placing the photocurable composition 20 on a surface of the mold 10, having the reverse pattern 12, as shown in FIG. 2, (b-2) a step of pressing a substrate 30 against the photocurable composition 20 on the surface of the mold 10, as shown in FIG. 2, (b-3) a step of irradiating the photocurable composition 20 with light in such a state that the substrate 30 is pressed against the photocurable composition 20, to cure the photocurable composition 20 to form a cured product, and (b-4) a step of separating the mold 10, or the substrate 30 and the mold 10, from the cured product to obtain a molded product having a fine pattern on its surface.

Process (c):

A process comprising the following steps (c-1) to (c-4):

(c-1) a step of bringing a substrate 30 and a mold 10 close to or in contact with each other so that the reverse pattern 12 of the mold 10 is on the substrate 30 side, as shown in FIG. 1, (c-2) a step of filing the space between the substrate 30 and the mold 10 with the photocurable composition 20, as shown in FIG. 1, (c-3) a step of irradiating the photocurable composition 20 with light in such a state that the substrate 30 and the mold 10 are close to or in contact with each other, to cure the photocurable composition 20 to form a cured product, and (c-4) a step of separating the mold 10, or the substrate 30 and the mold 10, from the cured product to obtain a molded product having a fine pattern on its surface.

The substrate may, for example, be a substrate made of an inorganic material or a substrate made of an organic material.

As the inorganic material, a silicon wafer, glass, quartz glass, a metal (such as aluminum, nickel or copper), a metal oxide (such as alumina), silicon nitride, aluminum nitride or lithium niobate, may, for example, be mentioned.

As the organic material, a fluororesin, a silicone resin, an acrylic resin, a polycarbonate, a polyester (such as polyethylene terephthalate), a polyimide, a polypropylene, a polyethylene, a nylon resin, a polyphenylene sulfide or a cyclic polyolefin may, for example, be mentioned.

As the substrate, a surface-treated substrate may be employed, since it is excellent in the adhesion with the photocurable composition. The surface treatment may, for example, be primer-coating treatment, ozone treatment or plasma etching treatment. As the primer, a silane coupling agent or silazane may, for example, be mentioned.

The mold may be a mold made of a non-light-transmitting material or a mold made of a light-transmitting material.

As the non-light-transmitting material, a silicon wafer, nickel, copper, stainless steel, titanium, SiC or mica may, for example, be mentioned. As the light-transmitting material, quartz, glass, a polydimethylsiloxane, a cyclic polyolefin, a polycarbonate, a polyethylene terephthalate or a transparent fluororesin may, for example, be mentioned.

At least one of the substrate and the mold is made of a material which transmits at least 40% of light having a wavelength with which the photopolymerization initiator (D) is reactive.

The mold has a reverse pattern on its surface. The reverse pattern is a reverse pattern-corresponding to the fine pattern on the surface of the molded product.

The reverse pattern has fine convexes and/or concaves.

The convexes may, for example, be long convex lines extending on the surface of the mold or protrusions dotted on the surface.

The concaves may, for example, be long grooves extending on the surface of the mold or holes dotted on the surface.

The shape of the convex lines or grooves may, for example, be linear, curved or bent. The convex lines or grooves may be a plurality of stripes extending in parallel with one another.

The cross-sectional shape of the convex lines or grooves in a direction perpendicular to the longitudinal direction may, for example, be rectangular, trapezoidal, triangular or semicircular.

The shape of the protrusions or holes may, for example, be triangular prism, quadrangular prism, hexagonal column, cylindrical column, triangular pyramid, quadrangular pyramid, hexagonal pyramid, circular cone, hemispherical or polyhedral.

The width of convex lines or grooves is preferably from 50 nm to 500 µm, more preferably from 70 nm to 300 µm, on average. The width of the convex lines means the length of the bottom in the cross section in a direction perpendicular to the longitudinal direction. The width of the grooves means the length of the upper side in the cross section in a direction perpendicular to the longitudinal direction.

The width of the protrusions or holes is preferably from 50 nm to 500 µm, more preferably from 70 nm to 300 µm, on average. The width of the protrusions means the length of the bottom in the cross section in a direction perpendicular to the longitudinal direction, in a case where the bottom side is elongated, or otherwise means the maximum length at the bottom surface of the protrusions. The width of the holes means the length of the upper side in the cross section in the direction perpendicular to the longitudinal direction when the opening is elongated, or otherwise, means the maximum length at the openings of the holes.

The height of the convexes is preferably from 50 nm to 500 μm, more preferably from 70 nm to 300 μm, on average.

The depth of the concaves is preferably from 50 nm to 500 μm, more preferably from 70 nm to 300 μm, on average.

In an area where the reverse pattern is dense, the distance between the adjacent convexes (or concaves) is preferably from 50 nm to 500 μm, more preferably from 70 nm to 300 μm, on average. The distance between the adjacent convexes means the distance from the terminal edge of the bottom in the cross section of a convex to the starting edge of the bottom in the cross section of the adjacent convex. The distance between the adjacent concaves means the distance from the terminal edge of the upper side in the cross section of a concave to the starting edge of the upper side in the cross section of the adjacent concave.

The minimum dimension of a convex is preferably from 50 nm to 500 μm, more preferably from 70 nm to 300 μm, particularly preferably from 70 nm to 150 μm. The minimum dimension means the minimum dimension among the width, length and height of the convex.

The minimum dimension of a concave is preferably from 50 nm to 500 μm, more preferably from 70 nm to 300 μm, particularly preferably from 70 nm to 150 μm. The minimum dimension means the minimum dimension among the width, length and depth of the concave.

Step (a-1):

The method for placing the photocurable composition may, for example, be an ink jetting method, a potting method, a spin coating method, a roll coating method, a casting method, a dip coating method, a die coating method, a Langmuir-Blodgett method or a vacuum vapor deposition method.

The photocurable composition may be placed over the entire surface of the substrate or on a part of the surface of the substrate.

Step (a-2):

The pressing pressure (gauge pressure) at the time of pressing the mold against the photocurable composition is preferably more than 0 and not more than 10 MPa, more preferably from 0.1 MPa to 5 MPa. The temperature at the time of pressing the mold against the photocurable composition is preferably from 0 to 100° C., more preferably from 10 to 60° C.

Step (b-1):

The method for placing the photocurable composition may, for example, be an ink jetting method, a potting method, a spin coating method, a roll coating method, a casting method, a dip coating method, a die coating method, a Langmuir-Blodgett method or a vacuum vapor deposition method.

The photocurable composition may be placed over the entire surface of the reverse pattern of the mold, or on a part of the reverse pattern, and it is preferably placed over the entire surface of the reverse pattern.

Step (b-2):

The pressing pressure-(gauge pressure) at the time of pressing the substrate against the photocurable composition is preferably more than 0 and not more than 10 MPa, more preferably from 0.1 MPa to 5 MPa. The temperature at the time of pressing the substrate against the photocurable composition is preferably from 0 to 100° C., more preferably from 10 to 60° C.

Step (c-2):

The method for filing the space between the substrate and the mold with the photocurable composition may, for example, be a method of aspirating the photocurable composition into the space by a capillary phenomenon.

The temperature at the time of filling with the photocurable composition is preferably from 0 to 100° C., more preferably from 10 to 60° C.

Steps (a-3), (b-3) and (c-3):

The method for irradiation with light may, for example, be a method wherein using a mold made of a light-transmitting material, light is applied from the mold side, or using a substrate made of a light-transmitting material, light is applied from the substrate side. The wavelength of the light is preferably from 200 to 500 nm. At the time of irradiation with light, the photocurable composition may be heated to accelerate the curing.

The temperature at the time of irradiation with light is preferably from 0 to 100° C., more preferably from 10 to 60° C.

Steps (a-4), (b-4) and (c-4):

The temperature at the time of separating the mold, or the substrate and the mold, from the cured product, is preferably from 0 to 100° C., more preferably from 10 to 60° C.

Figure 3:
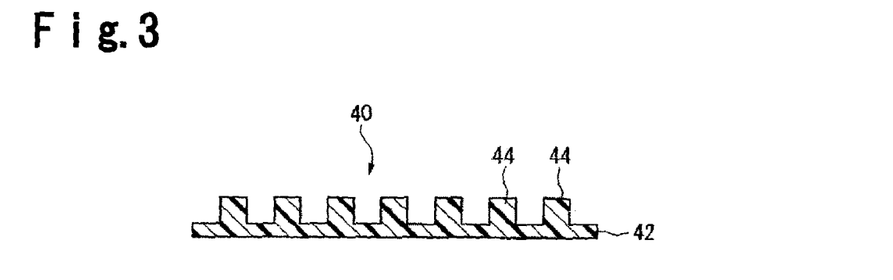
FIG. 3 is a cross-sectional view illustrating an embodiment of the molded product having a fine pattern on its surface.

In a case where the substrate and the mold are separated from the cured product, a molded product 40 having a fine pattern 44 on its surface is obtainable, which is composed solely of a cured product 42 having a surface on which a reverse pattern of the mold is transferred, as shown in FIG. 3.

Figure 4:
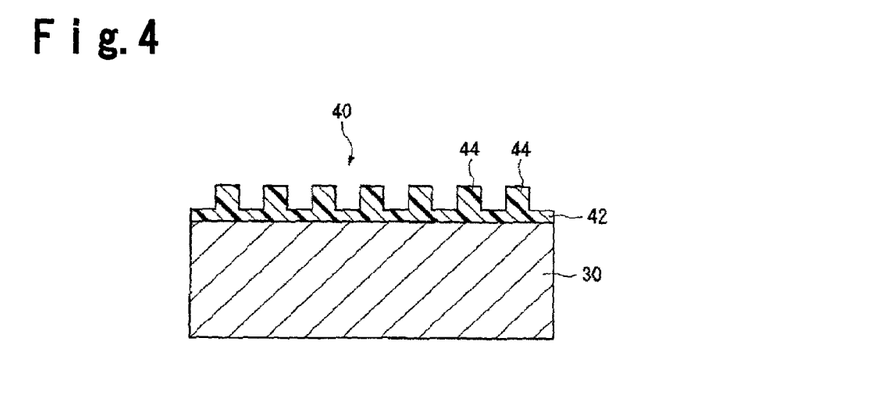
FIG. 4 is a cross-sectional view illustrating another embodiment of the molded product having a fine pattern on its surface.

In a case where only the mold is separated from the cured product, a molded product 40 (laminate) having a fine pattern 44 on its surface is obtainable, which comprises the substrate 30 and the cured product 42 having a surface on which the reverse pattern of the mold is transferred, as shown in FIG. 4.

As the molded product having a fine pattern on its surface, the following articles may be mentioned.

Optical elements: A microlens array, an optical waveguide, an optical switching element (such as a grid polarizing element or a wavelength plate) a Fresnel zone plate element, a binary element, a blaze element, a photonic crystal, etc.

Antireflection components: An AR (anti reflection) coating component, etc.

Chips: A biochip, a chip for μ-TAS (micro-total analysis systems), a microreactor chip, etc.

Others: Recording media, a display material, a carrier for a catalyst, a filter, a sensor component, a resist which will be used for the preparation of semiconductor devices, a daughter mold for nanoimprint, a replica mold for nickel electroforming, etc.

When used as a resist, a fine pattern can be formed on a substrate by etching the substrate by using the molded product having the fine pattern as a mask.

By the above process for producing a molded product having a fine pattern on its surface according to the present invention, since the photocurable composition of the present invention whereby a cured product provided with both the release property and the flexibility can be obtained is used, it is possible to produce a flexible molded product having on its surface a fine pattern having a reverse pattern of the mold precisely transferred.

EXAMPLES

Now, the present invention will be described in further detail with reference to Examples, but it should be understood that the present invention is by no means restricted to such Examples.

Examples 1 to 15 and 31 are Working Examples of the present invention, and Examples 16 to 30 are Comparative Examples.

(Molecular Weight)

The mass average molecular weight (based on polystyrene) of the compound (A) was measured by using a GPC system (HLC-8220 manufactured by TOSOH CORPORATION, THF solvent).

(Hardness)

The hardness after curing of the photocurable composition was obtained as follows.

The photocurable composition was put in a Petri dish, and it was irradiated with light from a high pressure mercury lamp (a light source having main wavelengths of 254 nm, 315 nm and 365 nm at from 1.5 to 2.0 kHz) under a nitrogen atmosphere to obtain a cured product.

Such cured products were laminated so that air would not enter to obtain a laminate having a thickness of at least 6 mm. The hardness was measured by pressing a hardness meter (WR-104A manufactured by Nishi Tokyo Seimitsu K.K., prescribed in JIS K-6301) against the surface of the laminate. When the hardness was from 50 to 85, the laminate was judged to have a moderate flexibility.

(Sensitivity)

The sensitivity of the photocurable composition was obtained as follows.

The photocurable composition was applied on the surface of a substrate by a spin coating method to form a coating film having a thickness of about 1.5 μm, which was irradiated with light from a high pressure mercury lamp (a light source having main wavelengths of 254 nm, 315 nm and 365 nm at from 1.5 to 2.0 kHz), whereby the integrated quantity of light until the composition was completely cured, was obtained and taken as the sensitivity. Whether or not the photocurable composition was completely cured, was judged by measuring the IR spectrum to see the presence or absence of an absorption of a carbon-carbon unsaturated double bond. The sensitivity was judged to be good when it was at most 1,000 mJ/cm$^2$.

(Viscosity)

The viscosity at 25° C. of the photocurable composition was measured by using a viscometer (TV-20, manufactured by TOKI SANGYO CO., LTD.) already corrected by a standard liquid JS50 (33.17 mPa·s at 25° C.), JS2000 (1,218 mPa·s at 25° C.) or JS5200 (28,854 mPa·s at 25° C.).

(Contact Angle)

The contact angle to water of the curable composition after curing was measured as follows.

The photocurable composition was irradiated for 15 seconds with light from a high pressure mercury lamp (a light source having main wavelengths of 254 nm, 315 nm and 365 nm at from 1.5 to 2.5 kHz) to obtain a cured product.

With respect to the cured product, the contact angle was measured by using a contact angle-meter (CA-X150 model, manufactured by Kyowa Interface Science Co., Ltd.) by dropping 4 μL of water on the surface of the cured product in accordance with JIS R3257.

The contact angle is an index for the release property of the cured product. When the contact angle was at least 85°, the release property was judged to be good.

(Compound (A))

Compound (A11): diurethane dimethacrylate of the above formula (A11) (manufactured by Aldrich, viscosity: 1.8 Pa·s, mass average molecular weight: 471).

Compound (A21): UA-4200 (viscosity: 2.0 Pa·s, mass average molecular weight: 1,300) manufactured by Shin-Nakamura Chemical Co., Ltd.

(Compound (B))

Compound (B11): 3,3,4,4,5,5,6,6,7,7,8,8,8-Tridecafluorooctyl acrylate (manufactured by Aldrich).

$$CH_2=CHCOOCH_2CH_2(CF_2)_6F \qquad (B11)$$

(Compound (C))

Compound (C1): 2-Methyl-2-adamantyl acrylate (manufactured by Idemitsu Kosan Co., Ltd.)

(C1)

Compound (C2): 2-Ethylhexyl acrylate (manufactured by Aldrich).

(C2)

(Photopolymerization Initiator (D))

Photopolymerization initiator (D1): Manufactured by Ciba Geigy Specialty, tradename: IRGACURE 651.

(Fluorinated Surfactant (E))

Fluorinated surfactant (E1): Non-ionic fluorinated surfactant, manufactured by AGC Seimi Chemical Co., Ltd., tradename: Surflon S-393.

(Compound (F))

Compound (F1): Tetraethylene glycol diacrylate (manufactured by Tokyo Chemical Industry Co., Ltd.).

Compound (F2): Trimethylolpropane triacrylate (Shin-Nakamura Chemical Co., Ltd.).

(Additive (G))

Additive (G1): An amorphous polyester resin (manufactured by Toyobo Co., Ltd., tradename: VYLON 220).

(Other Urethane Acrylate Compounds)

Compound (X): U-412A (viscosity: 20 Pa·s, mass average molecular weight: 4,700) manufactured by Shin-Nakamura Chemical Co., Ltd.

Compound (Y): UA-5201 (viscosity: 43 Pa·s, mass average molecular weight: 1,000) manufactured by Shin-Nakamura Chemical Co., Ltd.

The photocurable compositions were obtained and evaluated as in the following examples. The composition of the respective photocurable compositions are shown in Table 1, and the results of the evaluation of the respective photocurable compositions and the evaluation of the cured products obtained from the respective photocurable compositions are shown in Table 2.

Example 1

To a vial container (inner volume: 6 mL), 1.52 g of the compound (A11), 0.88 g of the compound (B11), 1.40 g of the compound (C1) and 0.04 g of the fluorinated surfactant (E1) were added, and then, 0.16 g of the photopolymerization initiator (D1) was mixed thereto, followed by filtration by a filter made of polytetrafluoroethylene (hereinafter referred to as PTFE) of 0.2 μm, to obtain a photocurable composition.

Example 2

To a vial container (inner volume: 6 mL), 0.60 g of the compound (A11), 1.00 g of the compound (B11), 2.12 g of the compound (C1) and 0.04 g of the fluorinated surfactant (E1) were added, and then, 0.24 g of the photopolymerization initiator (D1) was mixed thereto, followed by filtration by a filter made of PTFE of 0.2 μm, to obtain a photocurable composition.

Example 3

To a vial container (inner volume: 6 mL), 1.80 g of the compound (A11), 0.72 g of the compound (B11), 1.28 g of the compound (C1) aid-0.004 g of the fluorinated surfactant (E1) were added, and then, 0.20 g of the photopolymerization initiator (D1) was mixed thereto, followed by filtration by a filter made of PTFE of 0.2 μm, to obtain a photocurable composition.

Example 4

To a vial container (inner volume: 6 mL), 1.40 g of the compound (A11), 0.40 g of the compound (B11), 1.84 g of the compound (C1) and 0.04 g of the fluorinated surfactant (E1) were added, and then, 0.32 g of the photopolymerization initiator (D1) was mixed thereto, followed by filtration by a filter made of PTFE of 0.2 μm, to obtain a photocurable composition.

Example 5

To a vial container (inner volume: 6 mL), 0.74 g of the compound (A11), 1.20 g of the compound (B11), 1.88 g of the compound (C1) and 0.02 g of the fluorinated surfactant (E1) were added, and then, 0.16 g of the photopolymerization initiator (D1) was mixed thereto, followed by filtration by a filter made of PTFE of 0.2 μm, to obtain a photocurable composition.

Example 6

To a vial container (inner volume: 6 mL), 0.50 g of the compound (A11), 0.40 g of the compound (B11), 2.84 g of the compound (C1) and 0.02 g of the fluorinated surfactant (E1) were added, and then, 0.24 g of the photopolymerization initiator (D1) was mixed thereto, followed by filtration by a filter made of PTFE of 0.2 μm, to obtain a photocurable composition.

Example 7

To a vial container (inner volume: 6 mL), 1.80 g of the compound (A11), 1.20 g of the compound (B11), 0.80 g of the compound (C1) and 0.004 g of the fluorinated surfactant (E1) were added, and then, 0.20 g of the photopolymerization initiator (D1) was mixed thereto, followed by filtration by a filter made of PTFE of 0.2 μm, to obtain a photocurable composition.

Example 8

To a vial container (inner volume: 6 mL), 1.80 g of the compound (A11), 0.88 g of the compound (B11), 1.20 g of the compound (C1) and 0.02 g of the fluorinated surfactant (E1) were added, and then, 0.10 g of the photopolymerization initiator (D1) was mixed thereto, followed by filtration by a filter made of PTFE of 0.2 μm, to obtain a photocurable composition.

Example 9

To a vial container (inner volume: 6 mL), 1.56 g of the compound (A11), 0.80 g of the compound (B11), 1.20 g of the compound (C1) and 0.02 g of the fluorinated surfactant (E1) were added, and then, 0.42 g of the photopolymerization initiator (D1) was mixed thereto, followed by filtration by a filter made of PTFE of 0.2 μm, to obtain a photocurable composition.

Example 10

To a vial container (inner volume: 6 mL), 1.16 g of the compound (A11), 0.80 g of the compound (B11), 1.70 g of the compound (C1) and 0.18 g of the fluorinated surfactant (E1) were added, and then, 0.16 g of the photopolymerization initiator (D1) was mixed thereto, followed by filtration by a filter made of PTFE of 0.2 μm, to obtain a photocurable composition.

Example 11

To a vial container (inner volume: 6 mL), 1.52 g of the compound (A11), 0.88 g of the compound (B11), 1.40 g of the compound (C2) and 0.04 g of the fluorinated surfactant (E1) were added, and then, 0.16 g of the photopolymerization initiator (D1) was mixed thereto, followed by filtration by a filter made of PTFE of 0.2 μm, to obtain a photocurable composition.

Example 12

To a vial container (inner volume: 6 mL), 1.39 g of the compound (A11), 0.93 g of the compound (B11), 1.50 g of the compound (C1), 0.02 g of the fluorinated surfactant (E1) and 0.21 g of the compound (F1) were added, and then, 0.17 g of the photopolymerization initiator (D1) was mixed thereto, followed by filtration by a filter made of PTFE of 0.2 μm, to obtain a photocurable composition.

Example 13

To a vial container (inner volume: 6 mL), 1.08 g of the compound (A11), 1.04 g of the compound (B11), 1.65 g of the compound (C1), 0.05 g of the fluorinated surfactant (E1) and 0.70 g of the compound (F2) were added, and then, 0.19 g of the photopolymerization initiator (D1) was mixed thereto, followed by filtration by a filter made of PTFE of 0.2 μm, to obtain a photocurable composition.

Example 14

To a vial container (inner volume: 6 mL), 1.08 g of the compound (A21), 1.04 g of the compound (B11), 1.65 g of the compound (C1), 0.05 g of the fluorinated surfactant (E1) and 0.70 g of the compound (F1) were added, and then, 0.19 g of the photopolymerization initiator (D1) was mixed thereto, followed by filtration by a filter made of PTFE of 0.2 μm, to obtain a photocurable composition.

Example 15

To a vial container (inner volume: 6 mL), 1.30 g of the compound (A11), 0.96 g of the compound (B11), 1.54 g of the compound (C1), 0.02 g of the fluorinated surfactant (E1), 0.22 g of the compound (F1) and 0.13 g of the additive (G1) were added, and then, 0.17 g of the photopolymerization initiator (D1) was mixed thereto, followed by filtration by a filter made of PTFE of 0.2 µm, to obtain a photocurable composition.

Example 16

To a vial container (inner volume: 6 mL), 0.32 g of the compound (A11), 1.00 g of the compound (B11), 2.24 g of the compound (C1) and 0.12 g of the fluorinated surfactant (E1) were added, and then, 0.32 g of the photopolymerization initiator (D1) was mixed thereto, followed by filtration by a filter made of PTFE of 0.2 µm, to obtain a photocurable composition.

Example 17

To a vial container (inner volume: 6 mL), 2.20 g of the compound (A11), 0.60 g of the compound (B11), 1.00 g of the compound (C1) and 0.04 g of the fluorinated surfactant (E1) were added, and then, 0.16 g of the photopolymerization initiator (D1) was mixed thereto. However, phase separation took place, and it was not possible to obtain a uniform composition.

Example 18

To a vial container (inner volume: 6 mL), 1.80 g of the compound (A11), 0.12 g of the compound (B11), 1.88 g of the compound (C1) and 0.04 g of the fluorinated surfactant (E1) were added, and then, 0.16 g of the photopolymerization initiator (D1) was mixed thereto, followed by filtration by a filter made of PTFE of 0.2 µm, to obtain a photocurable composition.

Example 19

To a vial container (inner volume: 6 mL), 1.00 g of the compound (A11), 1.60 g of the compound (B11), 1.20 g of the compound (C1) and 0.04 g of the fluorinated surfactant (E1) were added, and then, 0.16 g of the photopolymerization initiator (D1) was mixed thereto. However, phase separation took place, and it was not possible to obtain a uniform composition.

Example 20

To a vial container (inner volume: 6 mL), 1.88 g of the compound (A11), 1.28 g of the compound (B11), 0.40 g of the compound (C1) and 0.12 g of the fluorinated surfactant (E1) were added, and then, 0.32 g of the photopolymerization initiator (D1) was mixed thereto. However, phase separation took place, and it was not possible to obtain a uniform composition.

Example 21

To a vial container (inner volume: 6 mL), 0.40 g of the compound (A11), 0.24 g of the compound (B11), 3.20 g of the compound (C1) and 0.04 g of the fluorinated surfactant (E1) were added, and then, 0.12 g of the photopolymerization initiator (D1) was mixed thereto, followed by filtration by a filter made of PTFE of 0.2 µm, to obtain a photocurable composition.

Example 22

To a vial container (inner volume: 6 mL), 1.16 g of the compound (A11), 0.80 g of the compound (B11), 2.00 g of the compound (C1) and 0.06 g of the fluorinated surfactant (E1) were added, and then, 0.02 g of the photopolymerization initiator (D1) was mixed thereto, followed by filtration by a filter made of PTFE of 5.0 µm, to obtain a photocurable composition.

Example 23

To a vial container (inner volume: 6 mL), 0.80 g of the compound (A11), 0.80 g of the compound (B11), 1.76 g of the compound (C1) and 0.04 g of the fluorinated surfactant (E1) were added, and then, 0.60 g of the photopolymerization initiator (D1) was mixed thereto. However, phase separation took place, and it was not possible to obtain a uniform composition.

Example 24

To a vial container (inner volume: 6 mL), 1.20 g of the compound (A11), 0.88 g of the compound (B11) and 1.76 g of the compound (C1) were added, and then, 0.16 g of the photopolymerization initiator (D1) was mixed thereto, followed by filtration by a filter made of PTFE of 5.0 µm, to obtain a photocurable composition.

Example 25

To a vial container (inner volume: 6 mL), 1.08 g of the compound (A11), 0.88 g of the compound (B11), 1.60 g of the compound (C1) and 0.28 g of the fluorinated surfactant (E1) were added, and then, 0.16 g of the photopolymerization initiator (D1) was mixed thereto. However, phase separation took place, and it was not possible to obtain a uniform composition.

Example 26

To a vial container (inner volume: 6 mL), 1.52 g of the compound (X), 0.88 g of the compound (B11), 1.40 g of the compound (C1) and 0.04 g of the fluorinated surfactant (E1) were added, and then, 0.16 g of the photopolymerization initiator (D1) was mixed thereto, followed by filtration by a filter made of PTFE of 0.2 µm, to obtain a photocurable composition. However, when the photocurable composition was irradiated with light from a high pressure mercury lamp (a light source having main wavelengths of 254 nm, 315 nm and 365 nm at from 1.5 to 2.0 kHz) to obtain a cured product, the cured product became turbid.

Example 27

To a vial container (inner volume: 6 mL), 1.52 g of the compound (Y), 0.88 g of the compound (B11), 1.40 g of the compound (C1) and 0.04 g of the fluorinated surfactant (E1) were added, and then, 0.16 g of the photopolymerization initiator (D1) was mixed thereto, followed by filtration by a filter made of PTFE of 0.2 µm, to obtain a photocurable composition. However, when the photocurable composition was irradiated with light from a high pressure mercury lamp (a light source having main wavelengths of 254 nm, 315 nm and 365 nm at from 1.5 to 2.0 kHz) to obtain a cured product, the cured product became turbid.

Example 28

To a vial container (inner volume: 6 mL), 1.40 g of the compound (B11), 2.26 g of the compound (C1), 0.06 g of the compound (E1) and 1.60 g of the compound (F1) were added, and then, 0.26 g of the photopolymerization initiator (D1) was mixed thereto, followed by filtration by a filter made of PTFE of 0.2 μm, to obtain a photocurable composition.

Example 29

To a vial container (inner volume: 6 mL), 1.52 g of pentaerythritol tetraacrylate (manufactured by Shin-Nakamura Chemical Co., Ltd., molecular weight: 352, viscosity: 1.2 Pa·s) instead of compound (A11), 0.88 g of the compound (B11), 1.40 g of the compound (C1) and 0.04 g of the fluorinated surfactant (E1) were added, and then, 0.16 g of the photopolymerization initiator (D1) was mixed thereto, followed by filtration by a filter made of PTFE of 0.2 μm, to obtain a photocurable composition.

Example 30

To a vial container (inner volume: 6 mL), 1.52 g of polyethylene glycol diacrylate having a molecular weight of 700 (manufactured by Aldrich, viscosity: 100 mPa·s) instead of the compound (A11), 0.88 g of the compound (B11), 1.40 g of the compound (C1) and 0.04 g of the fluorinated surfactant (E1) were added, and then, 0.16 g of the photopolymerization initiator (D1) was mixed thereto, followed by filtration by a filter made of PTFE of 0.2 μm, to obtain a photocurable composition.

TABLE 1

| | Mass % in 100 mass % of (A) + (B) + (C) + (D) + (E) | | | | | Parts by mass per 100 parts by mass of (A) + (B) + (C) + (D) + (E) | |
|---|---|---|---|---|---|---|---|
| | (A) | (B) | (C) | (D) | (E) | (F) | (G) |
| Ex. 1 | 38.0 | 22.0 | 35.0 | 4.0 | 1.0 | — | — |
| Ex. 2 | 15.0 | 25.0 | 53.0 | 6.0 | 1.0 | — | — |
| Ex. 3 | 45.0 | 18.0 | 32.0 | 4.9 | 0.1 | — | — |
| Ex. 4 | 35.0 | 10.0 | 46.0 | 8.0 | 1.0 | — | — |
| Ex. 5 | 18.5 | 30.0 | 47.0 | 4.0 | 0.5 | — | — |
| Ex. 6 | 12.5 | 10.0 | 71.0 | 6.0 | 0.5 | — | — |
| Ex. 7 | 45.0 | 30.0 | 20.0 | 4.9 | 0.1 | — | — |
| Ex. 8 | 45.0 | 22.0 | 30.0 | 2.5 | 0.5 | — | — |
| Ex. 9 | 39.0 | 20.0 | 30.0 | 10.5 | 0.5 | — | — |
| Ex. 10 | 29.0 | 20.0 | 42.5 | 4.0 | 4.5 | — | — |
| Ex. 11 | 38.0 | 22.0 | 35.0 | 4.0 | 1.0 | — | — |
| Ex. 12 | 34.7 | 23.2 | 37.4 | 4.2 | 0.5 | 5.3 | — |
| Ex. 13 | 27.1 | 25.9 | 41.2 | 4.7 | 1.2 | 17.6 | — |
| Ex. 14 | 27.1 | 25.9 | 41.2 | 4.7 | 1.2 | 17.6 | — |
| Ex. 15 | 32.6 | 23.9 | 38.6 | 4.3 | 0.6 | 5.4 | 3.3 |
| Ex. 16 | 8.0 | 25.0 | 56.0 | 8.0 | 3.0 | — | — |
| Ex. 17 | 55.0 | 15.0 | 25.0 | 4.0 | 1.0 | — | — |
| Ex. 18 | 45.0 | 3.0 | 47.0 | 4.0 | 1.0 | — | — |
| Ex. 19 | 25.0 | 40.0 | 30.0 | 4.0 | 1.0 | — | — |
| Ex. 20 | 47.0 | 32.0 | 10.0 | 8.0 | 3.0 | — | — |
| Ex. 21 | 10.0 | 6.0 | 80.0 | 3.0 | 1.0 | — | — |
| Ex. 22 | 29.0 | 20.0 | 50.0 | 0.5 | 1.5 | — | — |
| Ex. 23 | 20.0 | 20.0 | 44.0 | 15.0 | 1.0 | — | — |
| Ex. 24 | 30.0 | 22.0 | 44.0 | 4.0 | 0.0 | — | — |
| Ex. 25 | 27.0 | 22.0 | 40.0 | 4.0 | 7.0 | — | — |
| Ex. 26 | 38.0 (*1) | 22.0 | 35.0 | 4.0 | 1.0 | — | — |
| Ex. 27 | 38.0 (*2) | 22.0 | 35.0 | 4.0 | 1.0 | — | — |
| Ex. 28 | — | 35.0 | 56.5 | 6.5 | 1.6 | 4.0 | — |
| Ex. 29 | 38.0 (*3) | 22.0 | 35.0 | 4.0 | 1.0 | — | — |
| Ex. 30 | 38.0 (*4) | 22.0 | 35.0 | 4.0 | 1.0 | — | — |

In Table 1, (*1) is the proportion of the compound (X), (*2) is the proportion of the compound (Y), (*3) is the proportion of pentaerythritol, and (*4) is the proportion of polyethylene glycol diacrylate. "—" means that the compound (A), the compound (F), the additive (G), or the like was not used.

TABLE 2

| | Hardness | Sensitivity (mJ/cm$^2$) | Viscosity (mPa·s) | Contact angle (degree) |
|---|---|---|---|---|
| Ex. 1 | 74 | 441 | 66 | 91 |
| Ex. 2 | 82 | 315 | 43 | 91 |
| Ex. 3 | 66 | 315 | 115 | 87 |
| Ex. 4 | 76 | 315 | 82 | 87 |
| Ex. 5 | 80 | 441 | 53 | 93 |
| Ex. 6 | 82 | 441 | 49 | 86 |
| Ex. 7 | 63 | 315 | 103 | 89 |
| Ex. 8 | 63 | 567 | 105 | 91 |
| Ex. 9 | 72 | 441 | 72 | 90 |
| Ex. 10 | 78 | 441 | 40 | 90 |
| Ex. 11 | 71 | 441 | 58 | 90 |
| Ex. 12 | 78 | 441 | 43 | 91 |
| Ex. 13 | 84 | 441 | 59 | 92 |
| Ex. 14 | 61 | 441 | 48 | 91 |
| Ex. 15 | 70 | 441 | 94 | 90 |
| Ex. 16 | 92 | 441 | 18 | 91 |
| Ex. 17 | — | — | — | — |
| Ex. 18 | 71 | 441 | 113 | 70 |
| Ex. 19 | — | — | — | — |
| Ex. 20 | — | — | — | — |
| Ex. 21 | 85 | 6,300 | 18 | 79 |
| Ex. 22 | 78 | 7,560 | 34 | 81 |
| Ex. 23 | — | — | — | — |
| Ex. 24 | 74 | 441 | 22 | 68 |
| Ex. 25 | — | — | — | — |
| Ex. 26 | — | 441 | 230 | — |
| Ex. 27 | — | 441 | 360 | — |
| Ex. 28 | 94 | 441 | 16 | 91 |
| Ex. 29 | 83 | 441 | 65 | 78 |
| Ex. 30 | 74 | 882 | 30 | 75 |

In Table 2, "—" means that measurement was not carried out or could not be carried out.

Example 31

One droplet of the photocurable composition in Example 1 was dropped on the adhesive side of a polyethylene terephthalate (PET) film (COSMOSHINE A4100 manufactured by TOYOBO CO., LTD.) at 25° C., and then a quartz mold having on its surface concaves with a width of 800 nm, a depth of 180 nm and a length of 10 μm, was pressed against the photocurable composition on the PET film, followed by pressing under 0.5 MPa (gauge pressure) as it was.

Then, at 25° C., the photocurable composition was irradiated for 15 seconds with light from a high pressure mercury lamp (a light source having main wavelengths of 254 nm, 315 nm and 365 nm at from 1.5 to 2.0 kHz) from the mold side, to obtain a cured product of the photocurable composition. At 25° C., the mold was separated from the PET film to obtain a molded product 1 having formed on the surface of the PET film, a cured product having on its surface convexes having the concaves of the mold inverted. The heights of the convexes from the bottom to the top were from 178 to 180 nm.

One droplet of a commercial photocurable composition (manufactured by ThreeBond Co., Ltd., tradename: 3042B) was dropped on a silicon wafer at 25° C. to obtain a silicon wafer coated uniformly with the composition. The molded product 1 as a mold was pressed against the photocurable composition on the silicon wafer, followed by pressing under 1.0 MPa (gauge pressure) as it was.

Then, while this state was maintained, the photocurable composition was irradiated for 15 seconds with light from a high pressure mercury lamp (a light source having main wavelengths of 254 nm, 315 nm and 365 nm at from 1.5 to 2.0 kHz) from the side of the molded product 1, to obtain a cured product of the photocurable composition. At 25° C., the molded product 1 was separated from the silicon wafer to obtain a molded product 2 having formed on the surface of the silicon wafer, a cured product having on its surface concaves having the convexes of the mold inverted. The depths of the concaves were from 178 to 180 nm.

Industrial Applicability

The molded product having a fine pattern on its surface, obtainable by the process of the present invention, is useful as an optical element such as a microlens array, an optical waveguide element, an optical switching element (such as a grid polarizing element or a wavelength plate), a Fresnel zone plate element, a binary element, a blaze element or a photonic crystal, as an antireflection component, as a replica mold for production, or as a replica for nickel electroforming.

The entire disclosure of Japanese Patent Application No. 2008-311015 filed on Dec. 5, 2008 including specification, claims, drawings and summary is incorporated herein by reference in its entirety.

Reference Symbols

10: mold
12: reverse pattern
20: photocurable composition
30: substrate
40: molded product
42: cured product
44: fine pattern

What is claimed is:

1. A photocurable composition comprising:
a compound (A) having at least two urethane bonds and at least two (meth)acryloyloxy groups and having a mass average molecular weight of less than 2,000 and a viscosity at 25° C. of at most 20 Pa·s,
a compound (B) having fluorine atoms and at least one carbon-carbon unsaturated double bond (provided that the compound (A) is excluded),
a compound (C) having one (meth)acryloyloxy group (provided that the compound (B) is excluded),
a photopolymerization initiator (D), and
a fluorinated surfactant (E),
wherein in the total (100 mass %) of the compound (A), the compound (B), the compound (C), the photopolymerization initiator (D) and the fluorinated surfactant (E), the compound (A) is from 10 to 50 mass %, the compound (B) is from 5 to 35 mass %, the compound (C) is from 15 to 75 mass %, the photopolymerization initiator (D) is from 1 to 12 mass %, and the compound (E) is from 0.1 to 5 mass %.

2. A photocurable composition comprising:
a compound (A) having at least two urethane bonds and at least two (meth)acryloyloxy groups and having a mass average molecular weight of less than 2,000 and a viscosity at 25° C. of at most 20 Pa.s,
a compound (B) having fluorine atoms and at least one carbon-carbon unsaturated double bond (provided that the compound (A) is excluded),
a compound (C) having one (meth)acryloyloxy group (provided that the compound (B) is excluded),
a photopolymerization initiator (D), and
a fluorinated surfactant (E),
wherein in the total (100 mass %) of the compound (A), the compound (B), the compound (C), the photopolymerization initiator (D) and the fluorinated surfactant (E), the compound (A) is from 10 to 50 mass %, the compound (B) is from 5 to 35 mass %, the compound (C) is from 15 to 75 mass %, the photopolymerization initiator (D) is from 1 to 12 mass %, and the compound (E) is from 0.1 to 5 mass %, wherein the compound (A) is at least one member selected from the group consisting of a compound represented by the following formula (A1) and a compound represented by the following formula (A3):

$$(CH_2=CR-COO-(X-O)_s-CONH)_k-Q \quad (A1)$$

(A3)

wherein each of R, $R^{31}$, $R^{32}$ and $R^{33}$ which are independent of one another, is a hydrogen atom or a methyl group, X is a $C_{2-10}$ alkylene group, s is an integer of from 1 to 100, k is an integer of from 2 to 4, and Q is a k-valent group.

3. The photocurable composition according to claim 1, which contains substantially no solvent.

4. The photocurable composition according to claim 1, which further contains at most 40 parts by mass of a compound (F) having at least two (meth)acryloyloxy groups (provided that the compound (A) and the compound (B) are excluded) per 100 parts by mass of the total of the compound (A), the compound (B), the compound (C), the photopolymerization initiator (D) and the fluorinated surfactant (E).

5. The photocurable composition according to claim 1, which has a viscosity at 25° C. of from 30 to 500 mPa·s.

6. A process for producing a molded product having a fine pattern on its surface, which comprises:
a step of bringing the photocurable composition as defined in claim 1 into contact with a reverse pattern surface of a mold having the reverse pattern of said fine pattern on said surface,
a step of irradiating the photocurable composition with light in such a state that the photocurable composition is in contact with the surface of the mold, to cure the photocurable composition to form a cured product, and
a step of separating the mold from the cured product to obtain a molded product having a fine pattern on its surface.

7. A process for producing a molded product having a fine pattern on its surface, which comprises:
a step of placing the photocurable composition as defined in claim 1 on a surface of a substrate,
a step of pressing a mold having a reverse pattern of said fine pattern on its surface against the photocurable composition so that the reverse pattern of the mold is in contact with the photocurable composition,
a step of irradiating the photocurable composition with light in such a state that the mold is pressed against the photocurable composition, to cure the photocurable composition to form a cured product, and
a step of separating the mold, or the substrate and the mold, from the cured product to obtain a molded product having a fine pattern on its surface.

8. A process for producing a molded product having a fine pattern on its surface, which comprises:
- a step of placing the photocurable composition as defined in claim 1 on a reverse pattern surface of a mold having the reverse pattern of said fine pattern on said surface,
- a step of pressing a substrate against the photocurable composition,
- a step of irradiating the photocurable composition with light in such a state that the substrate is pressed against the photocurable composition, to cure the photocurable composition to form a cured product, and
- a step of separating the mold, or the substrate and the mold, from the cured product to obtain a molded product having a fine pattern on its surface.

9. A process for producing a molded product having a fine pattern on its surface, which comprises:
- a step of bringing a substrate and a mold having a reverse pattern of said fine pattern on its surface close to or in contact with each other so that the reverse pattern of the mold is on the substrate side,
- a step of filling the space between the substrate and the mold with the photocurable composition as defined in claim 1,
- a step of irradiating the photocurable composition with light in such a state that the substrate and the mold are close to or in contact with each other, to cure the photocurable composition to form a cured product, and
- a step of separating the mold, or the substrate and the mold, from the cured product to obtain a molded product having a fine pattern on its surface.

* * * * *